United States Patent
Dawei et al.

(10) Patent No.: US 11,909,390 B2
(45) Date of Patent: Feb. 20, 2024

(54) BUTTON STRUCTURE

(71) Applicant: Peratech Holdco Limited, North Yorkshire (GB)

(72) Inventors: You Dawei, Suzhou Industrial Park (CN); Li Zefeng, Suzhou Industrial Park (CN); Cao Jin, Suzhou Industrial Park (CN); Xu Feng, Suzhou Industrial Park (CN)

(73) Assignee: Peratech Holdco Limited, North Yorkshire (GB)

( * ) Notice: Subject to any disclaimer, the term of this patent is extended or adjusted under 35 U.S.C. 154(b) by 0 days.

(21) Appl. No.: 17/474,171

(22) Filed: Sep. 14, 2021

(65) Prior Publication Data

US 2023/0079619 A1    Mar. 16, 2023

(51) Int. Cl.
*H03K 17/96* (2006.01)
*H01H 13/20* (2006.01)
*H01H 13/14* (2006.01)

(52) U.S. Cl.
CPC ......... *H03K 17/9625* (2013.01); *H01H 13/14* (2013.01); *H01H 13/20* (2013.01); *H03K 2217/96015* (2013.01)

(58) Field of Classification Search
CPC ..... H03K 17/9625; H03K 2217/96015; H03K 17/96; H01H 13/14; H01H 13/20; H01H 3/12; H01H 13/50; H01H 13/70; H01H 13/7057; H01H 13/702; H01H 13/705; H01H 13/7065; H01H 2221/05; H01H 2221/024; H01H 2221/016; H01H 2221/012; H01H 25/04

See application file for complete search history.

(56) References Cited

U.S. PATENT DOCUMENTS

| | | | |
|---|---|---|---|
| 2012/0020045 A1* | 1/2012 | Tanase | H01H 13/86 200/600 |
| 2019/0080860 A1* | 3/2019 | Choi | H04M 1/18 |
| 2020/0133455 A1* | 4/2020 | Sepehr | G06F 3/0414 |
| 2022/0013310 A1* | 1/2022 | Choi | G06F 1/1671 |

* cited by examiner

*Primary Examiner* — Lheiren A Caroc
(74) *Attorney, Agent, or Firm* — Cooper Legal Group, LLC

(57) ABSTRACT

A button structure has a base having a slot and a sensing element inserted into the slot. A pressure concentration element is fixedly connected by bonding to the sensing element and a key cap is mounted to the base. The key cap has a core member fixedly connected to a lower surface of a top plate of the key cap. The lower surface of the core member can be brought into contact with the pressure concentration element on application of a pressure to an upper surface of the top plate, such that the applied pressure is transmitted to the sensing element through the core member and the pressure concentration part. The sensing element is a piezoresistive film sensor.

12 Claims, 9 Drawing Sheets

BUTTON STRUCTURE

BACKGROUND OF THE INVENTION

The present invention relates to a button structure, a handheld input device comprising the button structure, and an electronic gaming device.

Electronic gaming devices are often equipped with gaming input devices, handheld controllers or similar. These input devices are provided with buttons which traditionally operate in an on/off manner. A piezoresistive sensor can be utilized to improve the functionality of buttons to enhance user experience by taking advantage of the properties of a change in resistance in response to an applied pressure.

However, when piezoresistive sensors are installed into existing buttons, they can suffer from inaccurate positioning or fixing, and, when a force is applied, the force cannot consequently be accurately transmitted to the piezoresistive sensor. This leads to insensitivity and a reduced experience for the user.

BRIEF SUMMARY OF THE INVENTION

According to a first aspect of the present invention, there is provided a button structure, comprising: a base comprising a slot; a sensing element inserted into said slot; a pressure concentration element fixedly connected to said sensing element; and a key cap mounted to said base, said key cap comprising a core member fixedly connected to a lower surface of a top plate of said key cap; wherein said core member comprises a lower surface configured to be brought into contact with said pressure concentration element on application of a pressure to an upper surface of said top plate, such that said applied pressure is transmitted to said sensing element through said core member and said pressure concentration element.

Embodiments of the invention will be described, by way of example only, with reference to the accompanying drawings. The detailed embodiments show the best mode known to the inventor and provide support for the invention as claimed. However, they are only exemplary and should not be used to interpret or limit the scope of the claims. Their purpose is to provide a teaching to those skilled in the art. Components and processes distinguished by ordinal phrases such as "first" and "second" do not necessarily define an order or ranking of any sort.

DETAILED DESCRIPTION OF EMBODIMENTS OF THE INVENTION

FIG. 1

Figure 1:
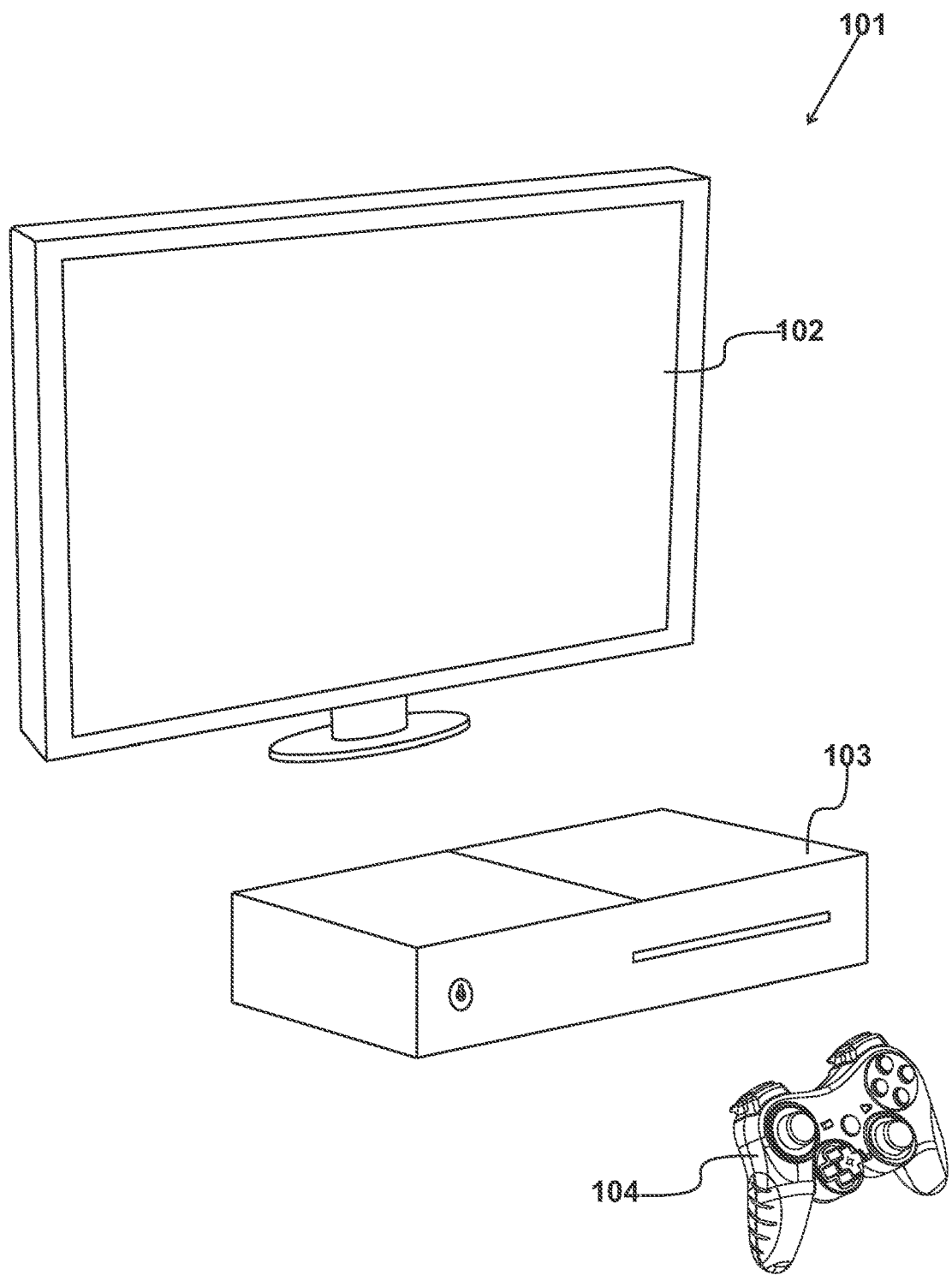
FIG. 1 shows an electronic gaming device comprising a handheld input device.

FIG. 1 shows the components of an electronic gaming device. Electronic gaming device 101 is the type which may alternatively be referred to as a games console or video games console.

Electronic gaming device 101 comprises a display device 102, a console unit 103 and a handheld input device, or controller 104.

In operation, console unit 103 is configured to provide a processor which can operate a computer game which is displayed on display device 102. Handheld input device 104 is configured to be held by a user to provide control inputs to console unit 103 to thereby operate, for example, characters or elements with the game, with corresponding outputs being presented to display device 102 for viewing by a user.

The relationship between a user, or game-player, and the handheld input device 104 is important as this has a significant impact on the enjoyment of a user's involvement in the game and its gameplay. The gaming experience can be negative for a user if an adequate input device is not provided. The handheld input device of the present invention aims to provide an enhanced game experience due to the presence of the improved button structure described herein.

FIG. 2

Figure 2:
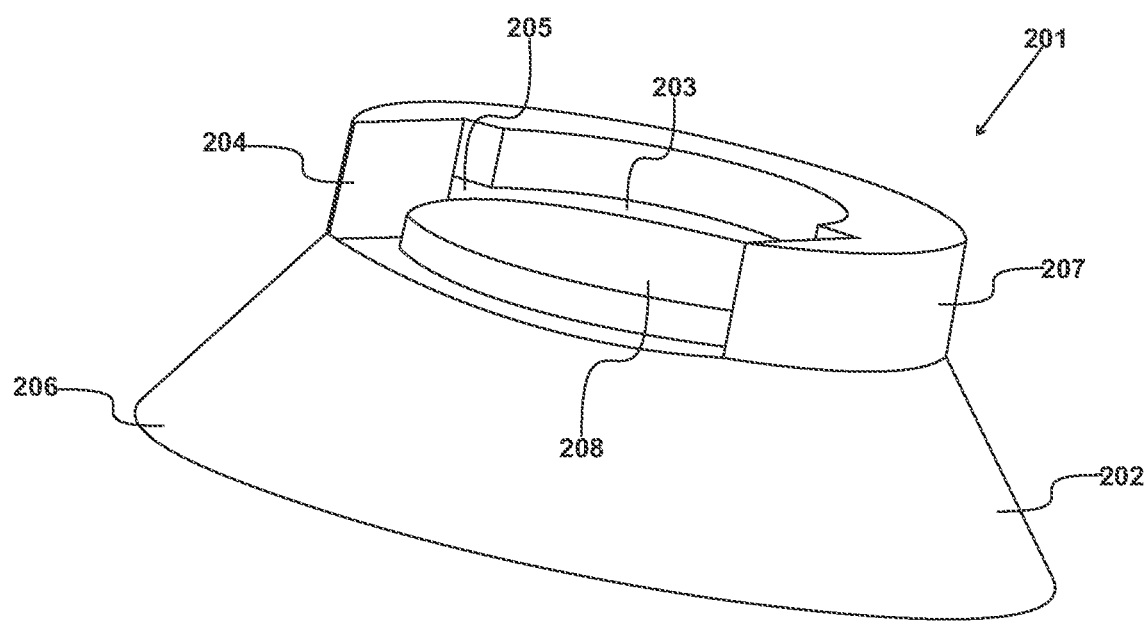
FIG. 2 shows a part of a button structure having a base comprising a slot.

A component forming part of a button structure in accordance with the invention is shown in perspective view in FIG. 2.

Component part 201 comprises a base 202 comprising a slot 203. In the embodiment, slot 203 comprises opening 204 and groove 205.

In the embodiment, base 202 comprises a first portion 206 which is shapes as a conical frustum and a second portion 207 which forms the slot. Second portion 207 is positioned on top of first portion 206. On the top surface of the conical frustrum, a supporting portion 208 is provided central to the diameter of the frustrum. Supporting portion 208 provides a support for a sensing element which will be described further with respect to FIG. 3.

While first and second portions are described separately herein, it is appreciated that the component part 201 may be provided as a single piece of material rather than as separate parts attached to each other.

FIG. 3

Figure 3:
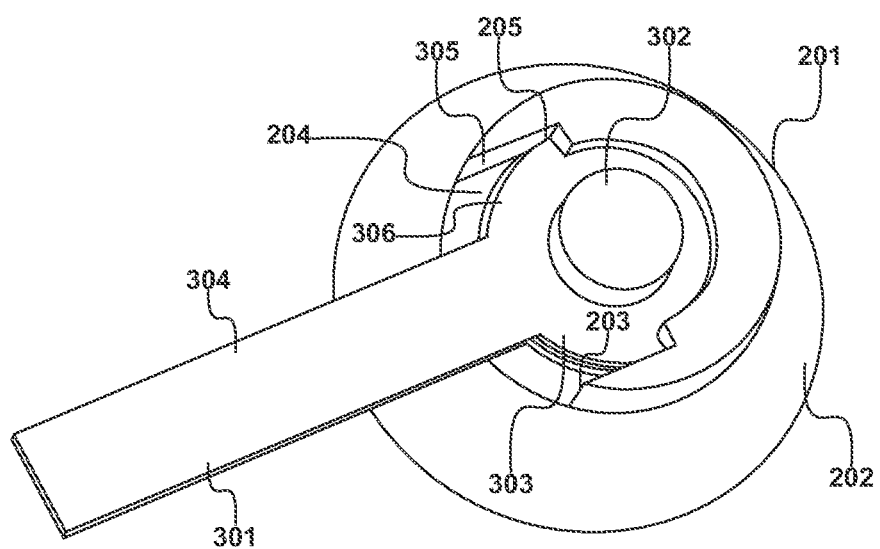
FIG. 3 shows the part of FIG. 2 in which a sensing element is inserted into the slot.

Component part 201 is shown in a perspective top view in FIG. 3. In the embodiment, a sensing element 301 is inserted into slot 203 and a pressure concentration element 302 is fixedly connected to sensing element 301.

In the embodiment, sensing element 301 comprises sensing sheet 303 and connector 304. Sensing sheet 303 is inserted into slot 203 and connector 304 is electrically connected to sensing sheet 303 and extends from slot 203 through opening 204. The sensing sheet 303 of sensing element 301 is received by groove 205 so as to secure the sensing element 301 in position. Groove 205 is provided with recessed portion 305 as shown. Recessed portion 305 allows for exposure of an upper surface 306 of sensing sheet 303 which enables attachment of pressure concentration element 302.

In manufacture, sensing element 301 is inserted into slot 203 and supported by supporting portion 208. In this way, slot 203 limits the movement of sensing element 301 as, by positioning the slot on a side wall of the base 202, sensing element 301 is aligned substantially horizontally relative to base 202.

Pressure concentration element 302 is fixedly connected to sensing element 301 as shown. In the embodiment, pressure concentration element 302 is fixedly connected to an upper surface 306 of sensing sheet 303. In a specific embodiment, pressure concentration element 302 is fixedly connected by bonding pressure concentration element 302 to sensing element 301. Bonding of the pressure concentration element 302 to sensing sheet 303 can be achieved by means of an adhesive material. In an embodiment, double-sided tape is utilized, although it is appreciated that in alternative embodiments, other forms of adhesive may be utilized.

In the embodiment, pressure concentration element 302 has a cross-section which is substantially circular. Pressure concentration element 302 is also columnar or cylindrical in shape. In alternative embodiments, it is appreciated that pressure concentration element 302 may also comprise a prism shape, such as a quadrangular prism, a hexagonal prism, a regular quadrangular prism, a regular hexagonal prism or any other suitable shape.

Pressure concentration element 302 may comprise any suitable material. In an embodiment, pressure concentration element 302 comprises a metallic material. In an alternative embodiment, pressure concentration element 302 comprises a plastics material. The plastics material may be a substantially hard plastics material.

In the embodiment, pressure concentration element 302 has a cross-sectional area which is smaller than the corresponding cross-sectional area of upper surface 306 of sensing sheet 303 as shown. Pressure concentration element 302 is further located in a substantially central position of upper surface 306 of sensing sheet 303.

The pressure concentration element 302 is thus positioned in a way such that a pressure, when applied via pressure concentration element 302, can be transmitted to sensing sheet 303 to enable sensing sheet 303 to respond quickly to pressure changes. By making pressure concentration element 302 smaller in cross-sectional area than sensing sheet 303, an applied pressure can be more effectively concentrated on the sensing sheet to enable a higher precision response. The central positioning of pressure concentration element 302 further allows an improvement in response to applied pressure.

FIG. 4

Figure 4:
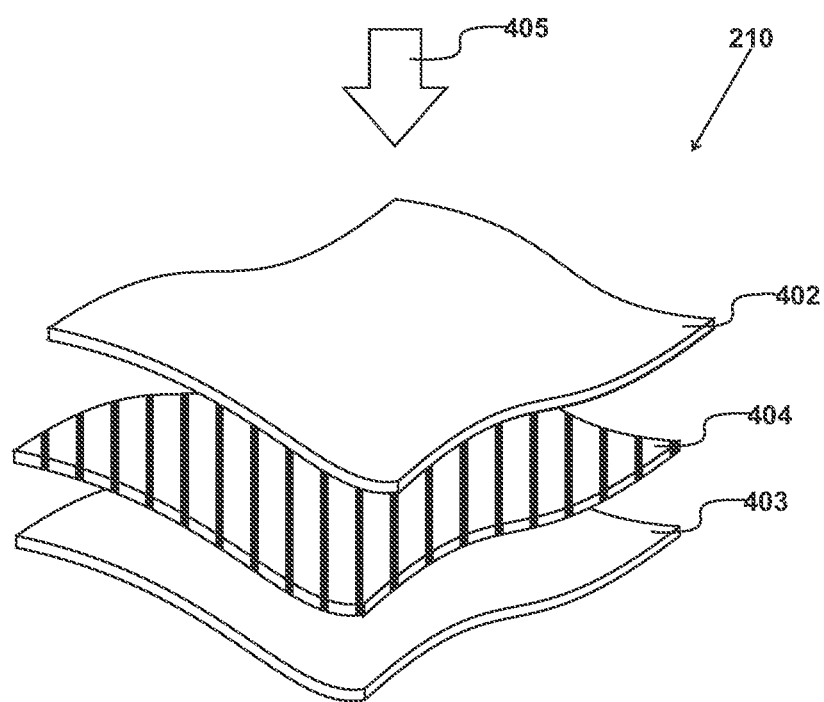
FIG. 4 shows a schematic representation of a piezoresistive sensor which forms the sensing element in an embodiment.

A schematic diagram of an example sensing element which may be substantially similar to sensing element 301 is shown in FIG. 4.

Sensing element 401 comprises a piezoresistive film sensor comprising a plurality of layers as shown. In the embodiment, sensing element 401 comprises first and second conductive layers 402 and 403 and a pressure sensitive resistive layer 404. In the embodiment, pressure sensitive resistive layer 404 comprises a quantum tunnelling material. The quantum tunnelling material is a material which exhibits a change in electrical resistance in response to a change in force or pressure applied 405. Quantum tunnelling materials of this type are available from the present applicant, Peratech Holdco Limited, Brompton-on-Swale, United Kingdom under the registered trade mark QTC®.

Thus, in use, when a pressure 405 is applied to the layers, conductive layers 402 and 403 are brought together to compress pressure sensitive resistive layer 404. When the layers are brought together in this way, a conductive path through the layers is created and a variable quantum channel is produced due to a change in the shape of the nanoparticles in the material. Thus, when a variable pressure 405 is applied, sensing element 401 provides a variable resistance output and the change in resistance value can be converted into a change in electrical signal. This can then be processed via the gaming controller for more responsive game play following user inputs to the input device and associated button structure.

FIG. 5

Figure 5:
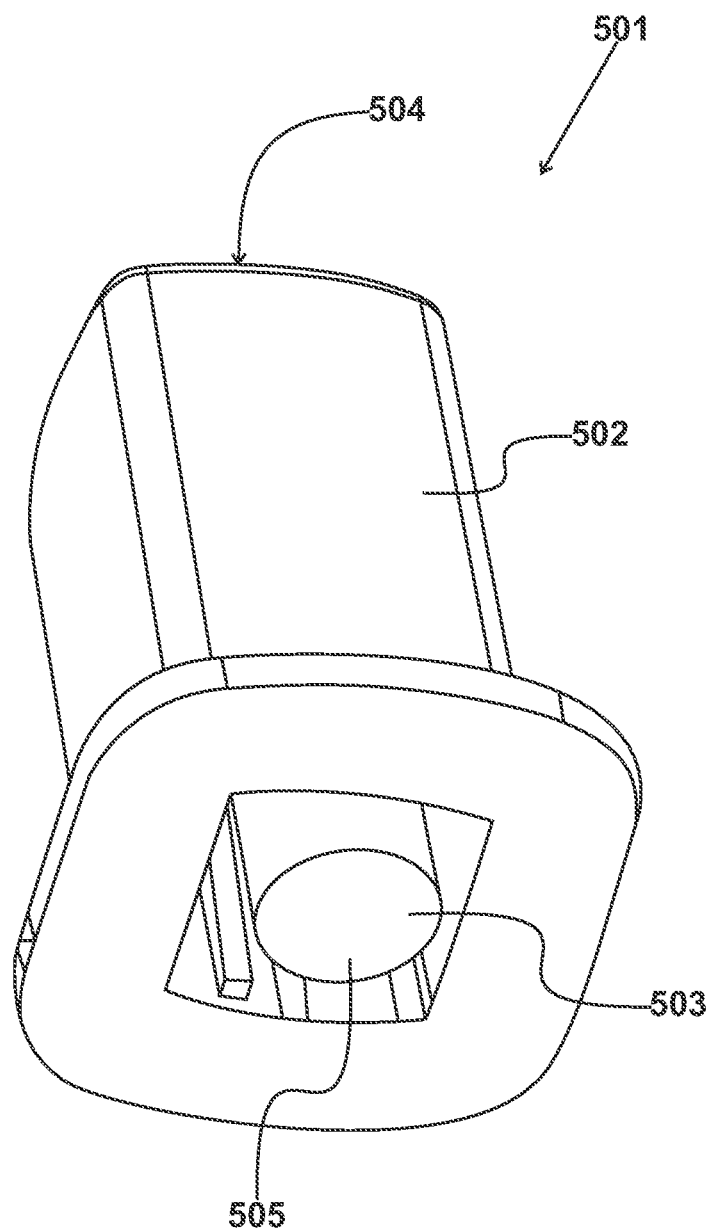
FIG. 5 shows a key cap of a button structure according to an embodiment of the invention.

An example key part forming part of a button structure in accordance with the present invention is shown in perspective view in isolation in FIG. 5.

Key cap 501 comprises a housing 502 and a core member 503. In the embodiment, core member 503 extends through key cap 501 and is fixedly connected to a lower surface of a top plate 504 of housing 502 of key cap 501.

Figure 6:
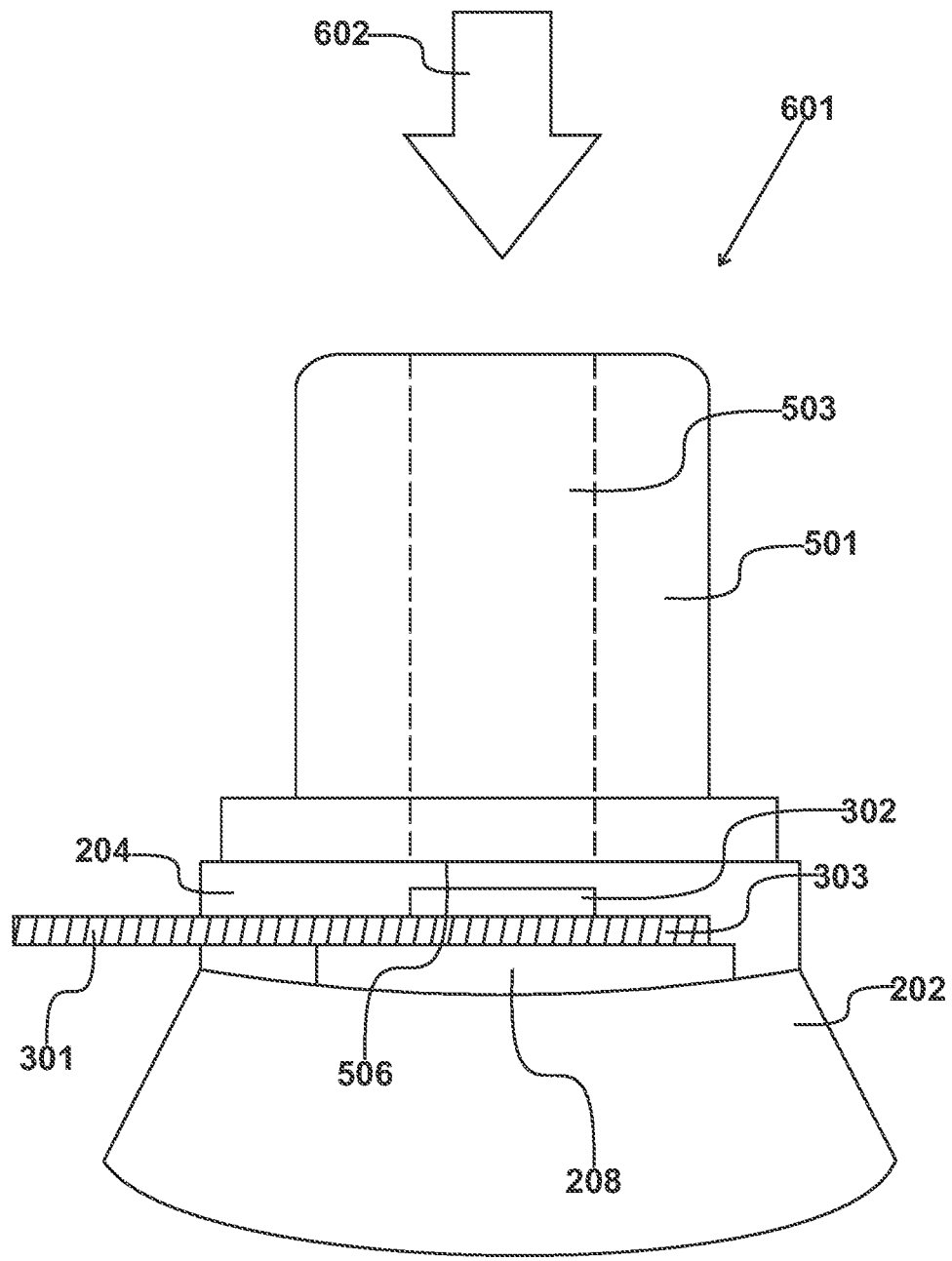
FIG. 6 shows a cross-sectional view of a button structure comprising the parts shown in FIGS. 3 and 5.

Core member 503 comprises a lower surface 506, which, when fully constructed, and, as illustrated with respect to FIG. 6, is configured to be brought into contact with the pressure concentration element 302 when an application of pressure is applied to an upper surface of top plate 504. This enables the pressure to be transmitted to the sensing element 301 via core member 503, as will be explained further with respect to FIG. 6.

FIG. 6

Button structure 601 is shown in a constructed use form in cross-section side view in FIG. 6.

In the embodiment, key cap 501 is mounted to base 202. Core member 503 extends through key cap 501 and is aligned with pressure concentration element 302. Sensing element 301 is supported on base 202 by supporting portion 208 with slot 203 of the base 202.

In use, a pressure 602 is applied to button structure 601 typically by a user applying a finger to key cap 501. When pressure 602 is applied, the lower surface 506 of core member 503 is brought into contact with pressure concentration element 302 such that the applied pressure 602 is transmitted to sensing element 301, and specifically the sensing sheet 303 which forms a sensing area, by means of the core member 503 and pressure concentration element 302.

In this way, the sensitivity of the sensing element 301 is improved due to the focusing of force 602 applied via the core member 503.

It is further noted that, as the opening direction of slot 203 and opening 204 is substantially perpendicular to applied pressure 602, sensing element 301 is retained in place in slot 203 and does not move around when pressure 602 is applied. This also maintains sensing sheet 303 in alignment with core member 503 to ensure more accurate sensing and higher precision and response for a user.

FIG. 7

Figure 7:
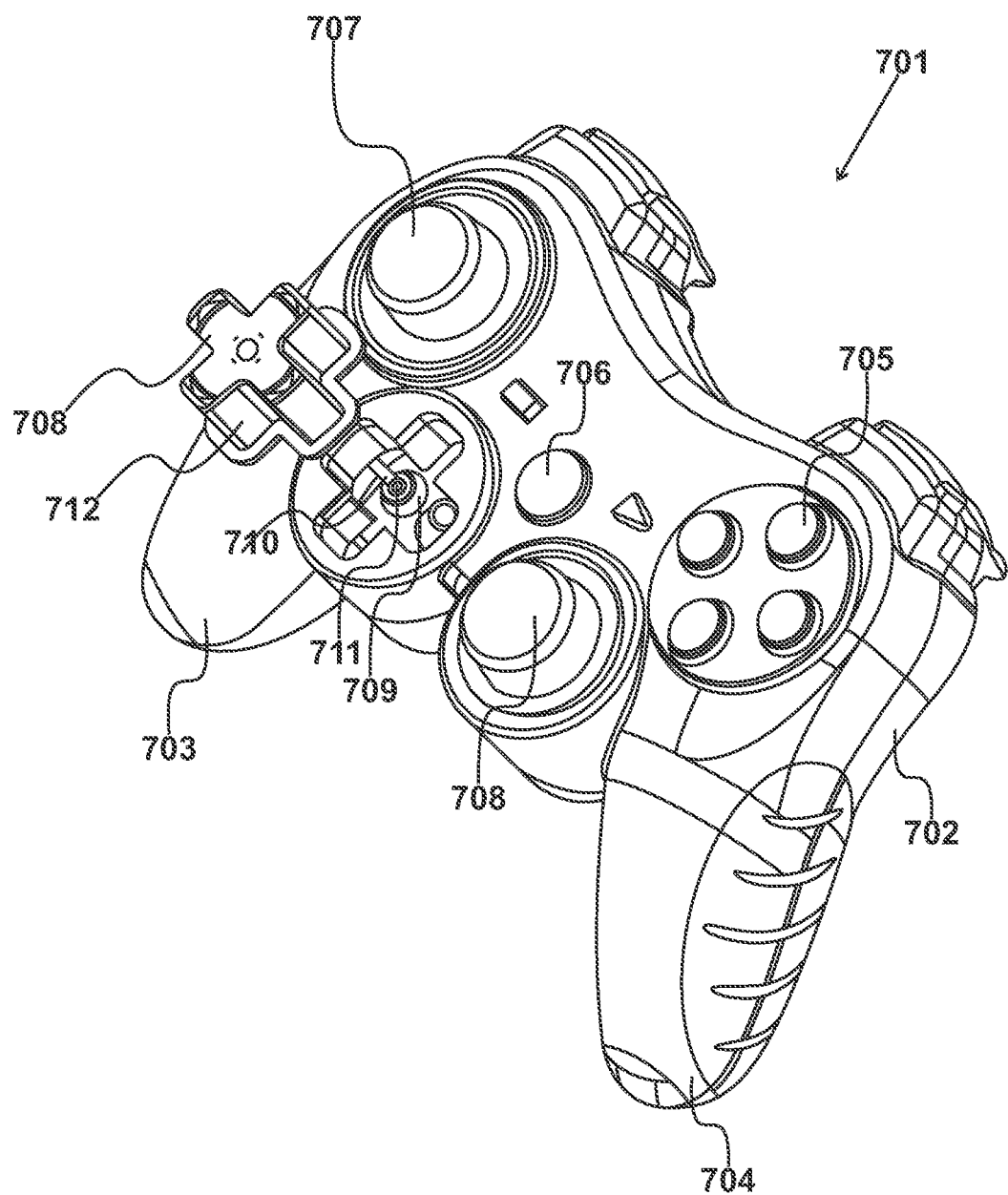
FIG. 7 shows an example handheld input device comprising a button structure of the invention in exploded form.

An example handheld input device 701 which incorporates the button structure described herein is shown in exploded form in FIG. 7.

The handheld input device 701 comprises a housing 702 which is configured to be held in a user's hand by means of handle portions 703 and 704. Handle portions 703 and 704 are ergonomically shaped to enable holding. Handheld input device 701 further comprises a plurality of input devices, typically provided in the form of buttons 705 and 706 and joystick controllers 707 or 708. It is appreciated that handheld input devices of this type may utilize various alternatives in this regard, and may have any suitable number of input devices for input from a user.

Handheld input device 701 further comprises a button structure 708 in accordance with the invention. Button structure 708 is shown in exploded form and comprises base 709, sensing element 710, pressure concentration element 711 and key cap 712 which are arranged in a substantially similar manner to those described previously.

In this embodiment, key cap 712 is configured as a cross direction key to enable a user to perform inputs in the form of up, down, left and right to change directions.

In use, a user can apply a force to the top surface of key cap 712 to operate handheld input device 701 in the manner described in FIG. 6.

FIG. 8

Figure 8:
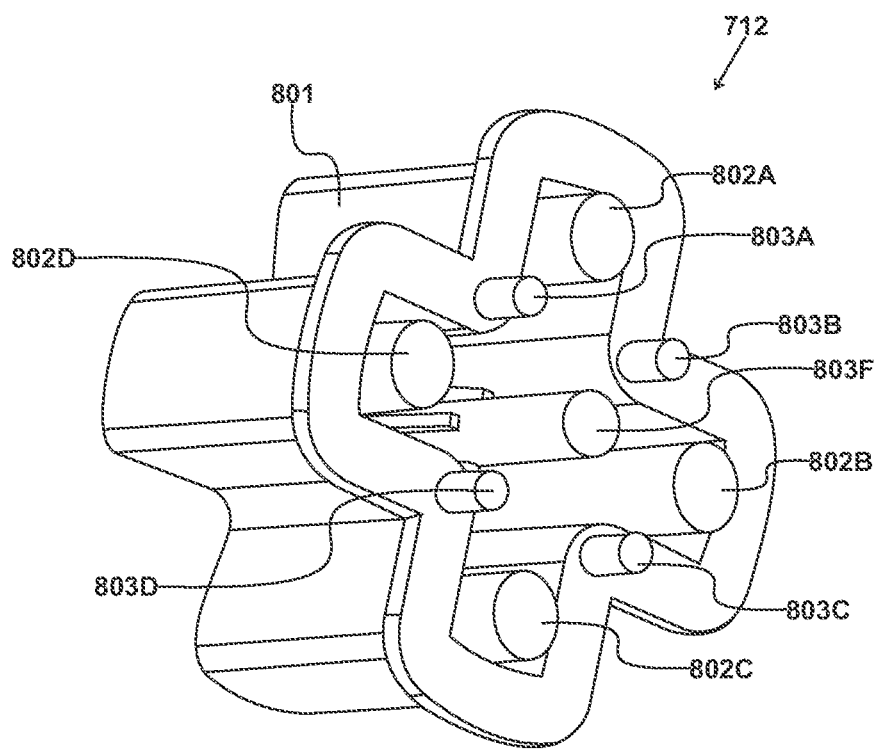
FIG. 8 shows an embodiment of a key cap in accordance with the present invention in combination with the handheld input device of FIG. 7.

Key cap 712 is shown in isolation in FIG. 8. Key cap 712 is substantially cross-shaped to form a cross-shaped direction key and button structure. In the embodiment, key cap 712 comprises a housing 801 and a plurality of core members 802. Each core member 802 is fixed to a lower surface of the top plate of housing 801. Supporting members 803 are further provided to key cap 712 to provide support to key cap 712 when constructed.

In the embodiment, each core member 802 comprises a lower surface which, in a substantially similar way as described previously, is conjured to be brought into contact with a pressure concentration element to transmit a pressure through the core member to a sensing element of the button structure.

FIG. 9

Figure 9:
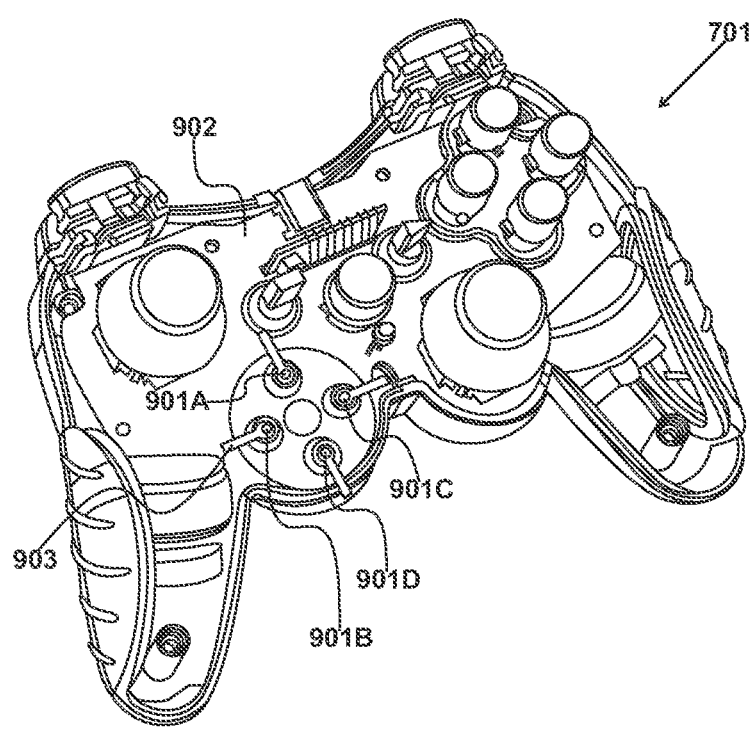
FIG. 9 shows a cutaway view of the handheld input device of FIG. 7 comprising a plurality of button structures.

A cutaway view of the handheld input device 701 is shown in FIG. 9. The arrangement illustrates four button structures 901, each comprising a base, sensing element and pressure concentration element described previously.

Thus, each core member 802 of key cap 712 corresponds with one of the core members 802 to enable co-operation with key cap 712.

In the embodiment, handheld input device 701 further comprises a printed circuit board 902. The printed circuit board 902 is electrically connected to the connector of each sensing element. For example, the connector of sensing element 903 of button structure 901A is in electrical contact with printed circuit board 902 which is formed in the housing 702 of handheld input device 701. Thus, this allows the resistive signal from the sensing element to be processed via the printed circuit board 902.

Thus, in an example embodiment, the handheld input device 701 may be operated in the following manner. A user applies a pressure or force to key cap 712 triggering the sensing element of the button structure and causing a change in resistance in the sensing element in accordance with the change in applied pressure. The change in resistance is converted into a change in electrical signal which can be monitored by the controller of the electronic gaming device to ensure outputs corresponding to desired functional operations on the display device.

For example, when the sensing element is positioned under a key cap of a handheld gaming input device, a user may press a forward button and a character in the game may consequently move forwards. If the user presses the forward button at different pressures, the system can be configured to allow the character to move in the game at different speeds in response to the pressure. For example, an increase in user applied force from zero to two Newtons (0N to 2N) can increase speed from zero to one meter per second (0 m/s to 1 m/s).

The invention claimed is:

1. A button structure, comprising:
   a base comprising a slot;
   a sensing element inserted into said slot;
   a pressure concentration element fixedly connected by bonding to said sensing element; and
   a key cap mounted to said base, said key cap comprising a core member fixedly connected to a lower surface of a top plate of said key cap; wherein:
   said core member comprises a lower surface configured to be brought into contact with said pressure concentration element on application of a pressure to an upper surface of said top plate, such that said applied pressure is transmitted to said sensing element through said core member and said pressure concentration element;
   said sensing element comprises a piezoresistive film sensor;
   said slot comprises an opening and a groove for receiving said sensing element, and an opening direction of said opening is substantially perpendicular to said applied pressure to said key cap; and
   said opening direction extends in a direction extending perpendicular to a surface of said base defining said slot.

2. The button structure of claim 1, wherein said piezoresistive film sensor comprises a quantum tunnelling material.

3. The button structure of claim 1, wherein said sensing element comprises a sensing sheet and a connector, said sensing sheet being inserted into said slot, and said connector being electrically connected to said sensing sheet.

4. The button structure of claim 1, wherein said groove is provided with a recessed portion.

5. The button structure of claim 1, wherein said pressure concentration element is bonded to an upper surface of said sensing element.

6. The button structure according to claim 1, wherein said pressure concentration element has a cross-sectional area which is smaller than a cross-sectional area of an upper surface of a sensing sheet of said sensing element.

7. The button structure according to claim 1, wherein said pressure concentration element has a cross-section which is substantially circular.

8. The button structure of claim 1, wherein said pressure concentration element is located in a substantially central position of an upper surface of a sensing sheet of said sensing element.

9. The button structure of claim 1, further comprising a printed circuit board electrically connected to a connector of said sensing element.

10. A handheld input device for gaming, comprising said button structure of claim 1.

11. The handheld input device of claim 10, comprising four button structures, said button structures being arranged in a cross shape to form a cross-shaped direction key.

12. An electronic gaming device, comprising said handheld input device of claim 10.

* * * * *